(12) United States Patent
Durston et al.

(10) Patent No.: US 9,162,875 B2
(45) Date of Patent: Oct. 20, 2015

(54) SENSORS

(75) Inventors: Michael Durston, Plymouth (GB); David Beasley, Plymouth (GB); Kevin Townsend, Plymouth (GB)

(73) Assignee: SILICON SENSING SYSTEMS LIMITED (GB)

( * ) Notice: Subject to any disclaimer, the term of this patent is extended or adjusted under 35 U.S.C. 154(b) by 312 days.

(21) Appl. No.: 13/639,703

(22) PCT Filed: Apr. 5, 2011

(86) PCT No.: PCT/EP2011/055285
§ 371 (c)(1),
(2), (4) Date: Oct. 30, 2012

(87) PCT Pub. No.: WO2011/124576
PCT Pub. Date: Oct. 13, 2011

(65) Prior Publication Data
US 2013/0199293 A1    Aug. 8, 2013

(30) Foreign Application Priority Data
Apr. 8, 2010  (GB) .................................. 1005875.8

(51) Int. Cl.
*B81B 7/00*    (2006.01)
*G01C 19/5684*    (2012.01)
*G01C 19/56*    (2012.01)

(52) U.S. Cl.
CPC ............... *B81B 7/008* (2013.01); *G01C 19/56* (2013.01); *G01C 19/5684* (2013.01)

(58) Field of Classification Search
CPC ........................... B81B 7/008; G01C 19/5684
USPC ........................................................ 73/504.13
See application file for complete search history.

(56) References Cited

U.S. PATENT DOCUMENTS

| | | | |
|---|---|---|---|
| 4,619,001 A * | 10/1986 | Kane | 455/192.3 |
| 5,783,973 A * | 7/1998 | Weinberg et al. | 331/35 |
| 7,434,465 B1 * | 10/2008 | Stewart | 73/504.13 |
| 2009/0007663 A1 * | 1/2009 | Uemura | 73/504.15 |
| 2009/0114015 A1 | 5/2009 | Steinlechner | |
| 2011/0285444 A1 * | 11/2011 | Uemura et al. | 327/299 |

FOREIGN PATENT DOCUMENTS

| | | |
|---|---|---|
| CN | 1532524 A | 9/2004 |
| CN | 101263364 A | 9/2008 |
| GB | 2 322 196 | 8/1998 |

(Continued)

OTHER PUBLICATIONS

International Search Report for PCT/EP2011/055285 dated Jun. 17, 2011.

(Continued)

*Primary Examiner* — Hezron E Williams
*Assistant Examiner* — Mark A Shabman
(74) *Attorney, Agent, or Firm* — Cantor Colburn LLP

(57) ABSTRACT

An inertial sensor is described in which a resonant element is driven by control electronics into resonance. The control electronics includes an oscillator. A circuit is provided for matching the frequency of the oscillator with the frequency of the output of the resonant element such that the time to operation from start up of the sensor is minimized and the requirement of frequency matching a given sensor to the control electronics is removed.

6 Claims, 1 Drawing Sheet

(56) References Cited

FOREIGN PATENT DOCUMENTS

| | | |
|---|---|---|
| JP | 2001512645 A | 8/2001 |
| JP | 2009503474 A | 1/2009 |
| JP | 2009198807 A | 9/2009 |
| JP | 2011083498 A | 4/2011 |
| WO | 2004020948 A | 3/2004 |

OTHER PUBLICATIONS

Chinese Office Action mailed Dec. 18, 2014 in corresponding Chinese Application No. 201180018073.8.

Japanese Office Action issued Nov. 28, 2014 in corresponding Japanese Patent Application No. 2013-503087.

* cited by examiner

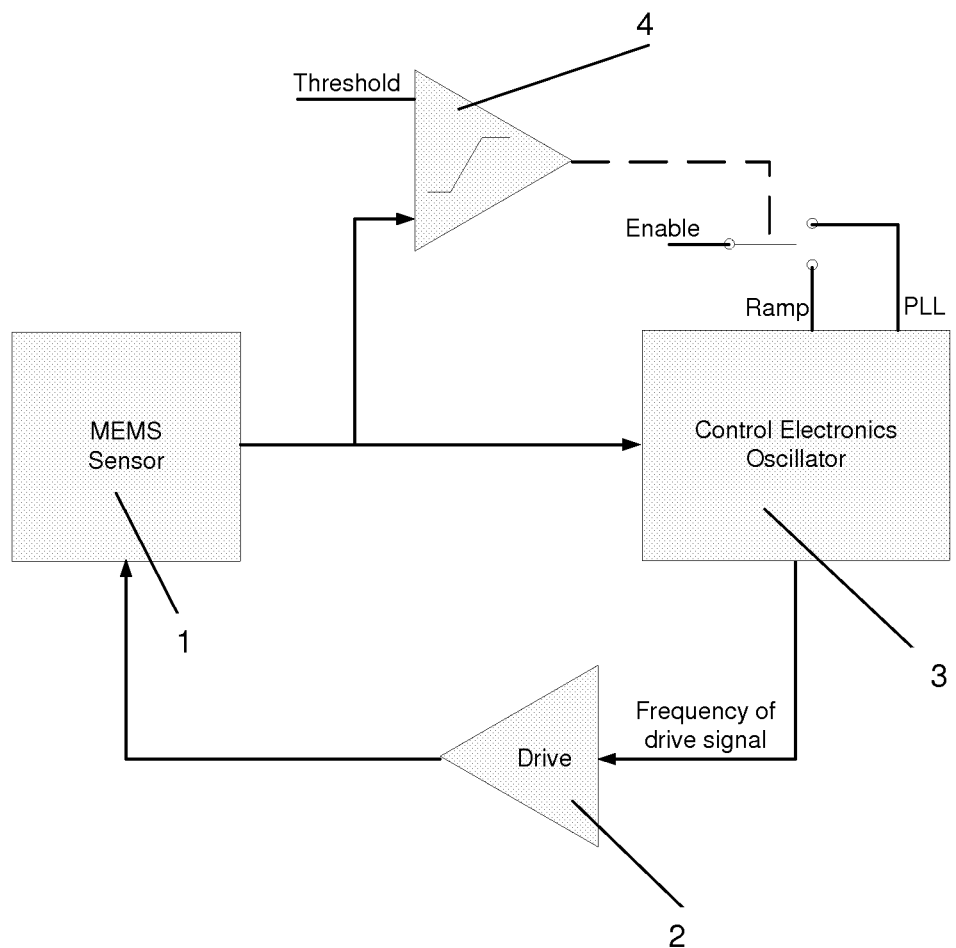

SENSORS

CROSS REFERENCE TO RELATED APPLICATION

The present application is the U.S. national stage application of International Application PCT/EP2011/055285, filed Apr. 5, 2011, which international application was published on Oct. 13, 2011, as International Publication WO 2011/124576. The International Application claims priority of British Patent Application 1005875.8, filed Apr. 8, 2010, the contents of which are incorporated herein by reference in their entireties.

The invention relates to sensors. More specifically but not exclusively it relates to sensors such as inertial sensors, for example accelerometers and gyroscopes, in which resonant frequency of a microelectromechanical system (MEMS) sensor must be matched with allied control electronics.

Many types of inertial sensors are known. Angular velocity sensors incorporating a MEMS sensor of a resonator ring type are known and such examples can be seen in, for example, GB2322196. In such angular velocity sensors a vibrating planar ring or hoop-like structure is disclosed. The ring-like structure is suspended in space by a suitable support mount for detecting turning rate, linear acceleration and angular acceleration. Turning rate is sensed by detecting vibrations coupled by Coriolis forces, whereas linear acceleration and angular acceleration are sensed by lateral, vertical and rocking movement of the entire ring or hoop-like structure within its mount.

In order to achieve this, the MEMS resonator is driven into resonance by a suitable driver signal generated by control electronics. However, it is necessary for the frequency of the control electronics to be matched, with a suitable tolerance, to the resonant frequency of the MEMS resonator.

Due to the 'Q' factor of the MEMS resonator the signals available when away from the resonant frequency are very small. The process tolerances of both the MEMS sensor and the control electronics (ASIC) are sufficiently large for there to be a significant difference in the MEMS resonant frequency compared to the control electronics oscillator frequency. Therefore, to ensure that on application of power (or applied reset signal) the rate sensor electronics will successfully lock to the resonant frequency of the MEMS device within a short time (less than 500 ms); it is typical that the control electronics must be trimmed to match the MEMS resonant frequency on a device by device basis. This requires a final rate sensor trimming process which adds time and cost to the production of the MEMS rate sensors.

According to the invention there is provided an inertial sensor comprising an element having a resonant frequency, the element being driven to resonance by suitable driver means, the sensor further comprising electronic control means including an oscillator capable of oscillation at variable frequencies in which the sensor further comprises comparator means for comparing the frequency of the output of the element with the frequency of the oscillator and locking the frequency of the oscillator once a predetermined frequency is achieved.

The invention will now be described with reference to the accompanying diagrammatic drawings in which:

FIG. 1 is a schematic drawing showing one form of circuit suitable for matching the frequency of an oscillator to the resonant frequency of a MEMS type ring sensor.

As shown in FIG. 1, a MEMS resonator 1 is driven by a suitable drive signal into resonance. The drive signal is generated by suitable drive means 2 under the control of suitable control electronics 3, including an oscillator. The output signal of the MEMS resonator 1 is input in to a threshold detector 4 and to the control electronics 3.

It will be appreciated that there are many other outputs of the MEMS resonator 1 that are processed by suitable processing means (not shown) to give data indicative of movement of the system.

On application of power (or release of applied reset signal) to the system, the control electronics 3 oscillator is forced to a frequency that is always less than the MEMS resonator frequency (taking into account all the relevant tolerances of MEMS and control electronics). The control electronics 3 then forces the oscillator frequency to ramp at a suitable speed while monitoring the amplitude of the MEMS transducer signals. When the frequency of the MEMS resonance is reached an increase in the MEMS transducer signals is detected and the control electronics stops the ramp of the oscillator frequency and switches to PLL (phase lock loop) mode.

The frequency of the oscillator is now suitably close to the MEMS resonator frequency to allow the system to lock to the MEMS in a short period of time.

By using this method the requirement to match the control electronics oscillator to the MEMS resonant frequency are removed and either allows the control electronics to be combined with the MEMS without the need to calibrate the electronics oscillator frequency or if the control electronics tolerances are still too large it allows the oscillator to be trimmed at wafer level to a generic value rather than matched to individual MEMS frequencies.

It will be appreciated that the circuit detects the dc level after demodulation and looks for a certain threshold. When the threshold is reached the system latches to PLL mode. The PLL loop then pulls the system into the final correct resonant frequency. A peak detector may be used in place of the threshold detector but is not specifically required for the embodiment described above. Additionally, the point of detecting the pickoff signal due to reaching the resonant frequency can be implemented at various points (i.e. before the demod).

Whilst the above embodiment described above refers to ring type MEMS sensors, it will be appreciated that the invention may be applied to any suitable form of sensor. For example, it can be applied to any form of sensor where there is a requirement to lock to a resonant frequency using a PLL type loop.

It will be appreciated that the diagram shown in FIG. 1 is simplified for ease of disclosure. However, the comparator is a threshold detector. The level detected is after channel amplification and demodulation to a dc level.

The invention claimed is:

1. An inertial sensor comprising an element having a resonant frequency, the element being driven to resonance by a driver, the sensor further comprising electronic control means including an oscillator capable of oscillation at variable frequencies in which the sensor further comprises comparator means for comparing the frequency of the output of the element with the frequency of the oscillator and locking the frequency of the oscillator once a predetermined frequency of the oscillator that matches the frequency of the output of the element is achieved, the frequency of the oscillator is locked by a phase lock loop device.

2. An inertial sensor according to claim 1, in which the predetermined frequency is substantially the same as the resonant frequency of the element.

3. An inertial sensor according to claim 1, in which the element comprises a ring type MEMS sensor element having a known resonant frequency.

4. An inertial sensor according to claim 1, in which the comparator is a threshold detector.

5. An inertial sensor according to claim 1, in which the comparator is a peak detector.

6. An inertial sensor according to claim 1, in which the inertial sensor is a gyroscope, an accelerometer or any other angular velocity sensor.

* * * * *